United States Patent
Dubey

(10) Patent No.: US 7,219,281 B2
(45) Date of Patent: May 15, 2007

(54) BOUNDARY SCAN OF INTEGRATED CIRCUITS

(75) Inventor: Rohit Dubey, Allahabad (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 513 days.

(21) Appl. No.: 10/618,440

(22) Filed: Jul. 10, 2003

(65) Prior Publication Data

US 2004/0044937 A1    Mar. 4, 2004

(30) Foreign Application Priority Data

Jul. 29, 2002  (IN)  .......................... 783/DEL/2002

(51) Int. Cl.
*G01R 31/28* (2006.01)
(52) U.S. Cl. .................................... 714/727
(58) Field of Classification Search ................ 714/724, 714/727, 729
See application file for complete search history.

(56) References Cited

U.S. PATENT DOCUMENTS

| | | | | |
|---|---|---|---|---|
| 5,715,255 A | * | 2/1998 | Whetsel | 714/720 |
| 5,805,609 A | * | 9/1998 | Mote, Jr. | 714/726 |
| 5,828,824 A | * | 10/1998 | Swoboda | 714/25 |
| 6,028,983 A | * | 2/2000 | Jaber | 714/30 |
| 6,266,793 B1 | | 7/2001 | Mozdzen et al. | |
| 6,304,987 B1 | * | 10/2001 | Whetsel, Jr. | 714/724 |
| 6,314,539 B1 | * | 11/2001 | Jacobson et al. | 714/727 |
| 6,578,168 B1 | * | 6/2003 | Parulkar et al. | 714/727 |

FOREIGN PATENT DOCUMENTS

JP    2000111601 A  *  4/2000

OTHER PUBLICATIONS

"IEEE Standard Test Access Port and Boundary-Scan Architecture" © 2001, IEEE, Inc., New York, NY, USA.

* cited by examiner

*Primary Examiner*—Cynthia Britt
(74) *Attorney, Agent, or Firm*—Hogan & Hartson LLP

(57) ABSTRACT

An improved 2-bit boundary scan test circuit capable of applying boundary scan test vectors to the input of the core logic of a circuit, using a multiplexer for selectively coupling the output of a boundary scan register to the input of a boundary scan register or to the input of the core logic, and a selection circuit for controlling the multiplexer to enable the coupling when test vectors are required to be applied to the core.

17 Claims, 5 Drawing Sheets

BOUNDARY SCAN OF INTEGRATED CIRCUITS

FIELD OF THE INVENTION

This invention relates to the field of integrated circuits. More specifically the invention relates to the boundary scan test of integrated circuits.

BACKGROUND OF THE INVENTION

As integrated circuits become more complex, it becomes increasingly necessary to implement thorough testing for verifying functionality and conformance to specifications. At the same time the shrinking size of integrated circuits as well as the accelerating speed requirements of devices have propelled the development of smaller and faster testing methods. Various standards bodies have also been involved in developing test standards in an effort towards promoting standardization of test methods. To this end a "boundary-scan" testing specification was proposed and developed by the Joint Test Action Group (JTAG) which was later standardized as the IEEE standards 1149.1 specification. This boundary-scan test architecture offers the capability to test components efficiently whether embedded in assembled printed circuit board assemblies or in the form of integrated circuit devices.

The Boundary Scan Test architecture is capable of testing pin connections without using physical test probes. It is also capable of capturing functional data while a device is in normal operation. The boundary scan process can force signals onto pins, or capture data from pin or core logic signals. Captured test data is serially shifted into special boundary scan cells from where it can be serially shifted out and compared to expected results externally.

Boundary scan register cells are placed such that the state of each digital system pin can be controlled or observed using the boundary scan register. These cells may also allow the state of the system logic inputs and outputs to be controlled and observed respectively.

While the implementation of conventional IEEE 1149.1 compliant interfaces within components, such as integrated circuit chips, facilitates higher quality, low cost testing without the need for disclosure of the internal circuitry of the components under test, these benefits come at the expense of performance due to the signal path delay associated with boundary scan cells. Because of the performance penalty associated with conventional IEEE 1149.1-compliant boundary scan cells manufacturers have resisted compliance with the IEEE 1149.1 standard.

U.S. Pat. No. 6,266,793, proposes a method for boundary scanning with increased testability by adding one extra signal to the standard methods, so that input buffers and output buffers are also testable in a two bit bi-directional boundary scan cell. However this method can not be implemented with the standard "INTEST" instruction defined by IEEE standard 1149.1.

SUMMARY OF THE INVENTION

The object of this invention is to provide a method and device for boundary scan testing of integrated chips, in a manner that fully conforms to the IEEE standard 1149.1 in an efficient manner and in a small size.

Another object of this invention is to increase the operational speed of the boundary scan test process.

To achieve these and other objectives this invention provides an improved 2-bit boundary scan test circuit capable of applying boundary scan test vectors to the input of the core logic of a circuit, using a multiplexer for selectively coupling the output of a boundary scan register to the input of a boundary scan register or to the input of the core logic, and a selection circuit for controlling the multiplexer to enable the coupling when test vectors are required to be applied to the core. The invention also provides a method for improving a 2-bit boundary scan test circuit to provide the capability of applying boundary scan test vectors to the input of the core logic of the circuit, by providing a multiplexing arrangement to enable the selective coupling of the output of a boundary scan test register to the input of the core logic, and an arrangement for selectively enabling the multiplexing arrangement for coupling the output of the boundary scan test register when the test vectors are required to be applied to the core logic.

BRIEF DESCRIPTION OF THE DRAWINGS

The invention will now be described with reference to the accompanying drawings.

DETAILED DESCRIPTION

The invention will now described according to the accompanying drawings. The present invention is illustrated by way of example, and is not limited to the specific implementations of the accompanying figures or description.

Figure 1:
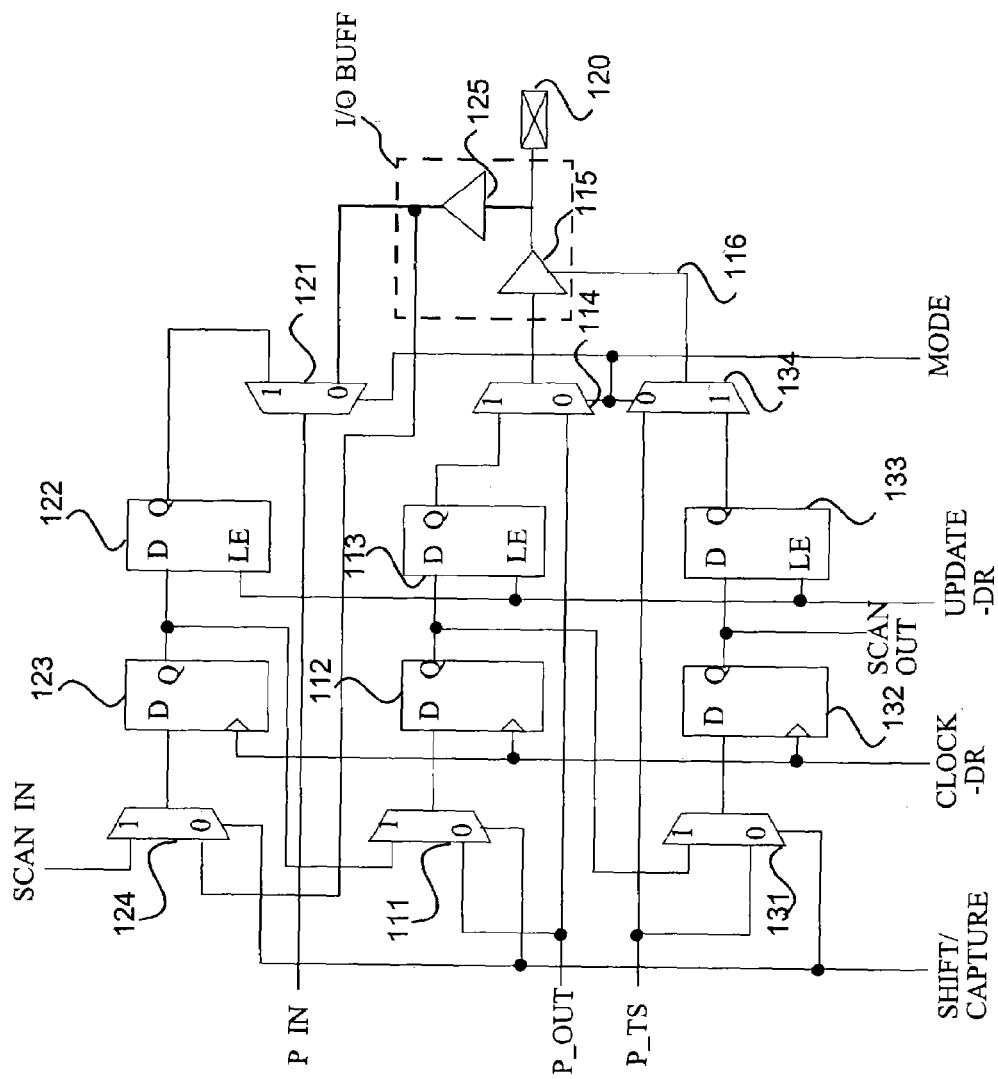
FIG. 1 shows the schematic logic diagram of a prior art JTAG boundary-scan cell containing three bit bi-directional boundary scan cell.

FIG. 1 shows a circuit for realizing a boundary scan cell according to the IEEE std. JTAG specification. In the full IEEE JTAG implementation, the boundary scan cell includes an input portion, an output portion, and a scan cell portion for providing tri-state control. Multiplexer 111 selects data to be coupled to a JTAG output capture register 112 from either the core logic P_OUT circuitry of the IC or from a previous stage. The selection is controlled by signal shift/capture from control logic JTAG circuit coupled to multiplexer 111. The capture register 112 can be loaded externally (from one of the five JTAG pins), or can capture data from one of the previous test clock cycles.

The shift/capture signal enables the data capture directly from the core logic P_OUT, P_TS, from the input buffer 125 or from the previous scanning stage. This last operation involves shifting all of the register stages of the boundary scan cell in a daisy chain. The JTAG data input pin is connected to the input of the first element SCAN IN in the daisy chain, and the output of the last element in the chain is connected to the JTAG output pin SCAN OUT. The registers get loaded during this process with data and can then be shifted until the desired stage has been reached.

An update register 113 is used on completion of shifting operation for proper alignment and presentation of the data at the output buffer 115. The output of register 113 is connected to one of the inputs of multiplexer 114, the second input of the multiplexer being connected directly to the core logic P_OUT with the output connected to buffer 115. Buffer 115 is controlled by signal line 116, and the output of the buffer is connected to pad 120 and routed to multiplexers 121, 124 through buffer 125. Buffer 125 is utilized to drive the voltage signal either the core logic P_IN of the IC via multiplexer 121, or to an input capture register 123. Multiplexer 124 selects either the input buffer 125, or the previous scan stage data captured in previous boundary scan cell. The selection is controlled by shift/capture signal. The output of multiplexer 124 connects to the input of capture register 123. The capture register 123 updates register 122, which can be routed back to the core logic via multiplexer 121. Multiplexers 121, 114, 134 are controlled by the mode signal. The signal 116 is the control signal for the buffer 115. The output of multiplexer 134 is the signal 116, which is either the captured data from control update register 133 or the control signal from the core logic P_TS. The input of control update register comes from control capture register 132. The control capture register selects between the tri-state signal from core, or data from previous scan stage through multiplexer 131. Multiplexer 131 is controlled by shift/capture signal.

This method for realizing a boundary scan design requires a substantial amount of circuitry which in turn increases the cost of operation, area of the chip, power consumption and introduces additional delays that reduce the speed of the device.

Figure 2:
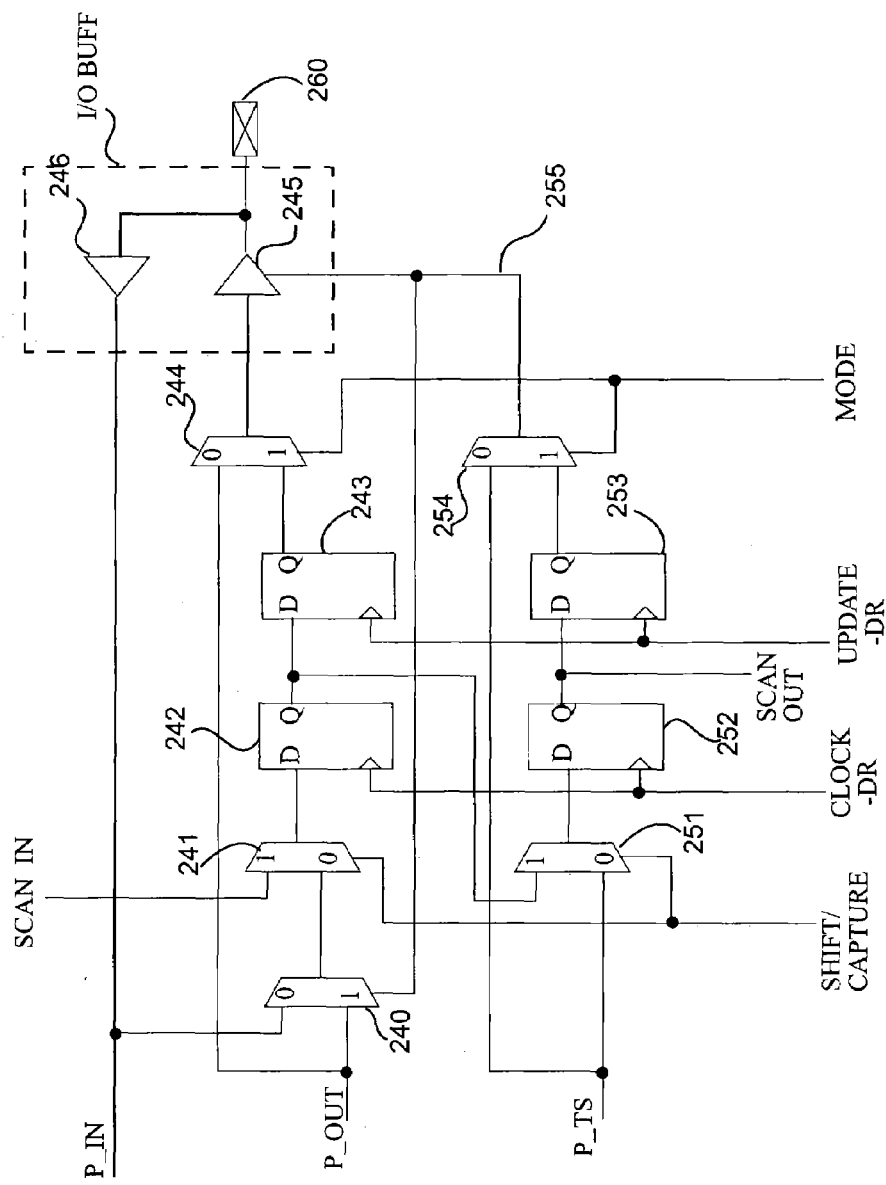
FIG. 2 is a schematic logic diagram of another prior art JTAG boundary-scan cell containing two bit bi-directional boundary scan cell.

FIG. 2 shows another prior art implementation of boundary scan circuitry that reduces the number of the registers used, in exchange for forgoing the INTEST capacity of the device. In this scan architecture only two capture registers 242, 252 are connected to the SCAN_IN input in a daisy connection through multiplexers 241, 251. The output SCAN_OUT of the capture register 252 serves as the line output for the serial scan of the daisy chained connection. The inputs of update registers 243 and 253 are connected to the outputs of capture registers 242 and 252 respectively. The outputs of the update registers 243, 253 are connected to the input of multiplexers 244 and 254. The output of multiplexer 244 is connected to the input of buffer 245 and the output 255 of multiplexer 254 controls buffer 245. The output of buffer 245 connects to pad 260, P_IN, and also serves as one of the inputs to multiplexer 240, through buffer 246. The core logic output P_OUT serves as the second input to multiplexers 240 and 244, while control signal P_TS serves as the second input to multiplexers 251 and 254. The second input to multiplexer 241 is the output of multiplexer 240. The select input of the multiplexer 240 is also the control signal of buffer 245. Multiplexers 241 and 251 share the same select control which also serves as the shift/capture pin. The select pins for the multiplexer 244, 254 are the MODE select lines. The MODE select line selects the mode of the operation of the device i.e. it determines whether the data is to be sent directly from the core to IO pad or visa-versa.

The operation of the circuit is similar to the operation of the circuit of FIG. 1. However this architecture is not capable of performing the INTEST function of the IEEE standard. Output buffer 245 is enabled by signal 255 that selects output data from core of IC for capture register 242 through multiplexer 240. Further the captured data can be connected to pad 260 through output buffer 245. When the output buffer is disabled by signal 255, the data coming from input buffer 246 can be captured in capture register 242. There is no mechanism for updating of the captured data to the core of IC which is needed for the INTEST instruction of IEEE JTAG standard 1149.1.

Figure 3:
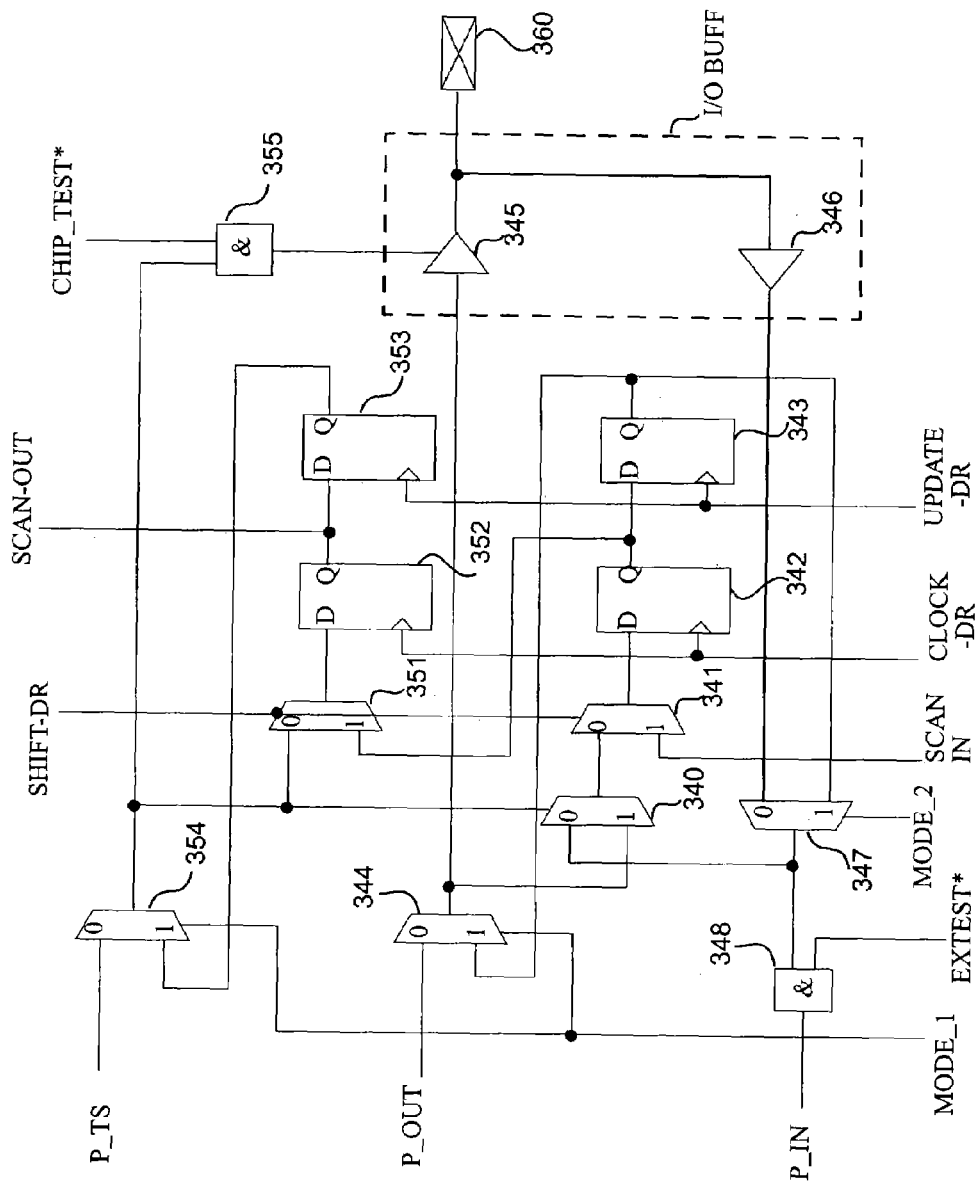
FIG. 3 shows schematic logic diagram of another prior art JTAG boundary-scan cell containing two bit boundary scan cell and enhanced testing capability.

FIG. 3 shows another prior art implementation of the boundary scan architecture offering improved testability and usability. This design enables testing of every path within the boundary scan cell. However the design results in an increased number of nodes. Gates 355 and 348 are introduced for providing extra control pins. Four signals MODE_1, MODE_2, EXTEST*, and CHIP_TEST* are derived from JTAG decode circuitry. Control signal EXTEST* is set 0 when EXTEST instruction is to be selected and prevents off-chip test data from reaching the on-chip system logic through AND gate 348. Control signal CHIP_TEST* is set to 0 when the INTEST or RUNBIST instruction is selected, and set to 1 when SAMPLE/PRELOAD or EXTEST instruction is selected and the output buffer is enabled/dibbled accordingly by AND gate 355. The MODE_1 and MODE_2 signals are controlled through JTAG decoder logic depending upon the instruction selected. Multiplexer 340 selects the output from multiplexer 347, or the output from multiplexer 344. Multiplexer 340 is controlled by the output signal from multiplexer 354. The capture of data through multiplexer 340 is controlled by MODE_1 and MODE_2. This architecture requires several extra control signals, which results in extra hardware in JTAG decoder circuitry and occupies more routing area of the IC.

Figure 4:
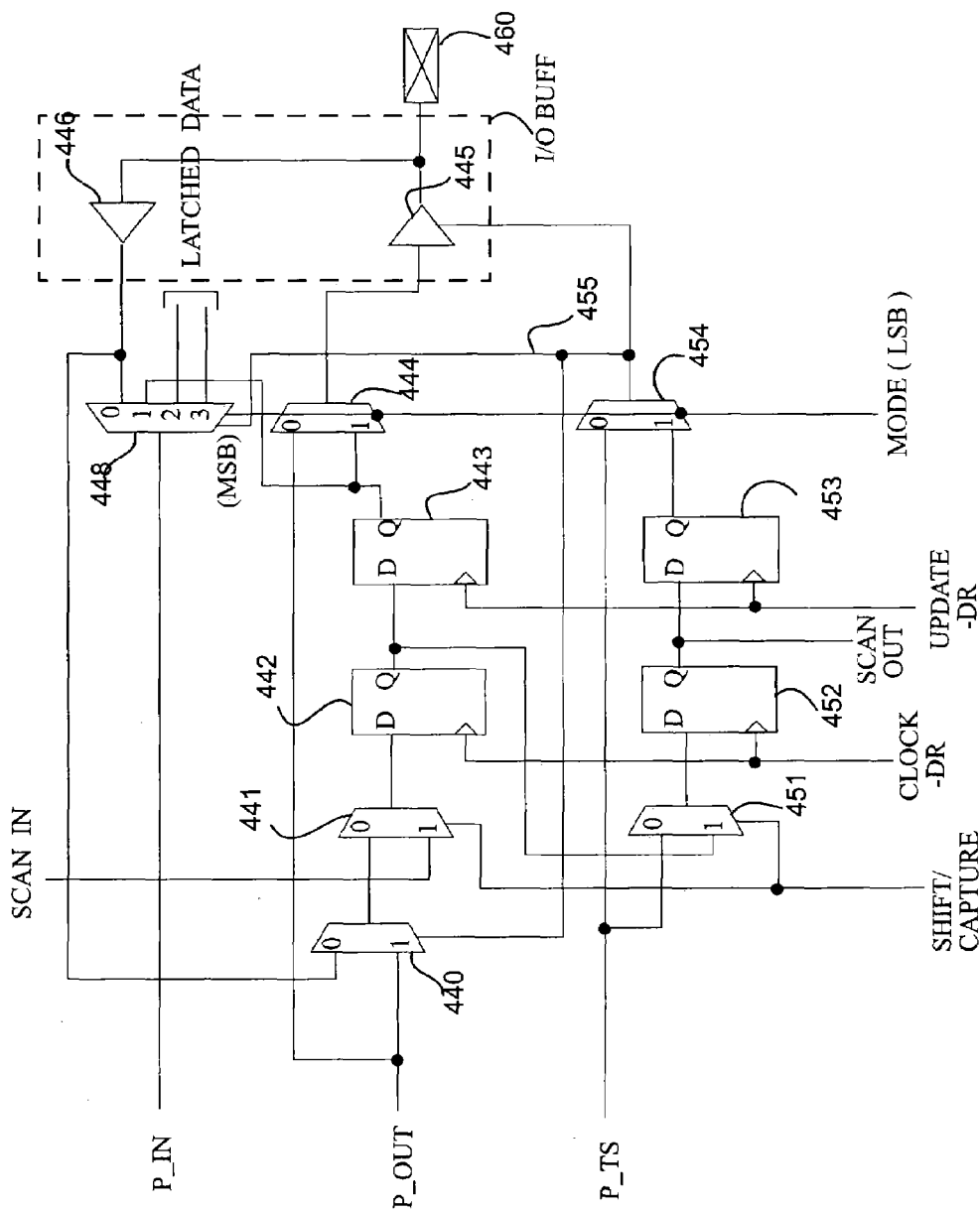
FIG. 4 shows schematic logic diagram of one embodiment of the boundary scan cell of the present invention having two bit boundary scan cell and added circuitry extends the use of boundary scan cell shown in FIG. 2 with every standard instruction.

FIG. 4 shows the schematic diagram of boundary scan architecture in accordance with the present invention. Two capture registers 442 and 452 are connected in daisy chain through multiplexers 441 and 451. The SCAN IN is connected to one of the inputs of multiplexer 441 and the SCAN OUT as the output of the capture register 452. The output of registers 442 and 452 are applied to the update registers 443 and 453 respectively the outputs of which are connected to the inputs of multiplexers 444 and 454. The output of multiplexer 444 is applied to the input of buffer 445 and the output 455 of multiplexer 454 controls buffer 445. The output of buffer 445 connects to pad 460, and also serves as one of the inputs to multiplexer 440, through buffer 446 and multiplexer 448. The output can also be connected as an input to the core logic P_IN through buffer 446 and multiplexer 448. The core logic output P_OUT serves as the second input to multiplexers 440 and 444, while control signal P_TS serves as the second input to multiplexers 451 and 454. The second input to multiplexer 441 is the output of multiplexer 440. The select input of multiplexer 440 is the control signal of buffer 445. Multiplexers 441 and 451 share the same select control, which serves as the shift/capture pin for the circuit. The select pin for multiplexers 444, 448 and 454 is the MODE select line which is also one of the select lines for multiplexer 448 while the second select line of multiplexer 448 is control signal 455 which serves as the select MSB for the multiplexer. This architecture is capable of implementing all the IEEE 1149.1 Std instructions and tests while using only a two bit boundary scan cell, reducing one cell in terms of hardware, thereby providing a reduced scan chain and increasing the testing speed. This arrangement also provides for the simultaneous testing of EXTEST and INTEST instructions, resulting in increased testing speed. The output of multiplexer 448 is selected by signal 455 (msb) from multiplexer 454 and JTAG mode signal (lsb). The multiplexer 448 selects captured data, or data from input buffer for the core logic of the IC. At the same time multiplexer 440 always selects data coming from input buffer when the boundary scan cell works as input, enabling EXTEST and INTEST instructions to operate independently or simultaneously. This arrangement uses less area, and less hardware resulting in smaller size. At the same time the novelty of performing EXTEST and INTEST simultaneously reduces the testing time.

Figure 5:
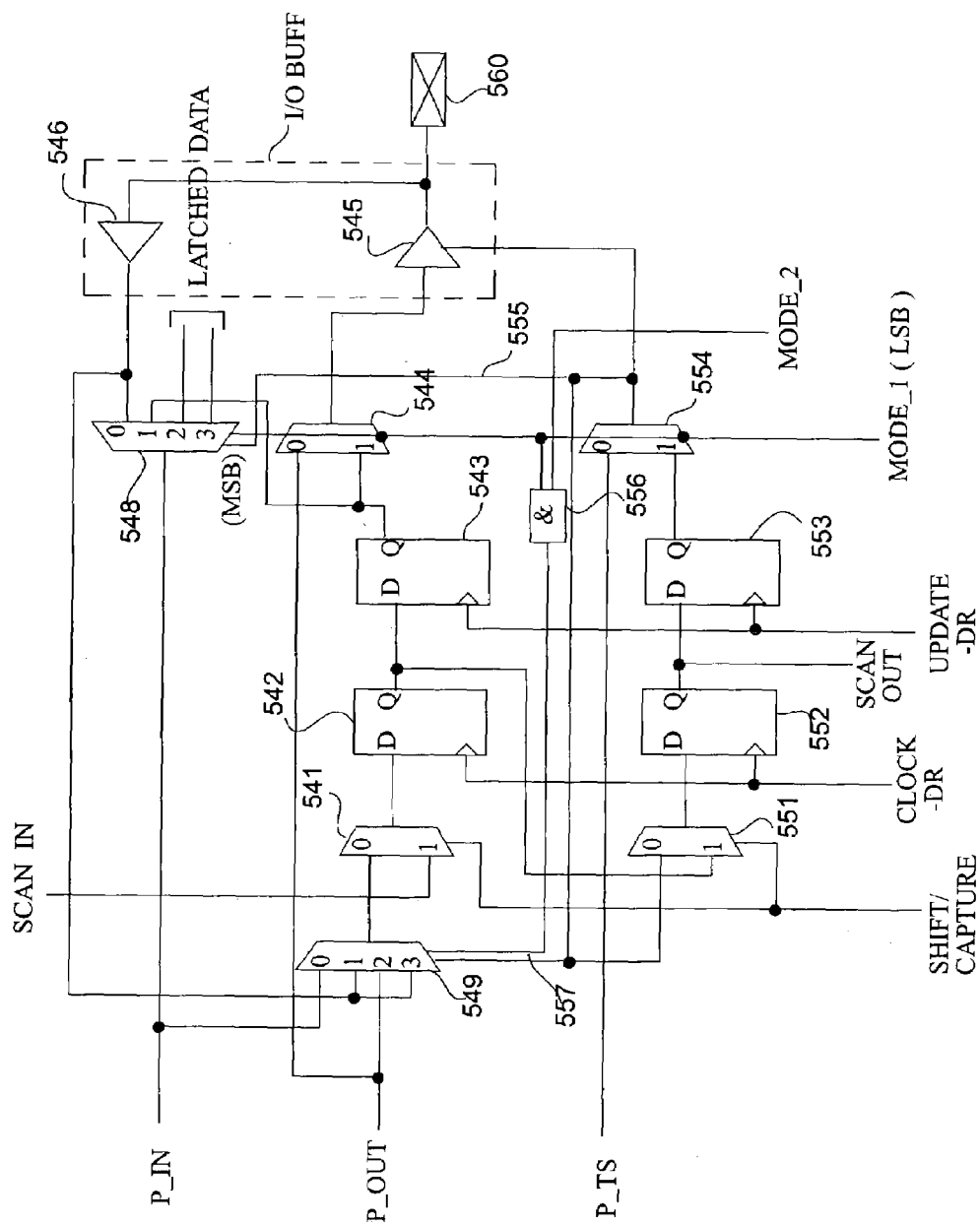
FIG. 5 is a logic schematic diagram of another embodiment of the boundary scan cell of the present invention with slight modification of FIG. 4 to enhance testability more than as in FIG. 3 using minimal signal and hard-ware.

FIG. 5 shows another embodiment of the present invention. In this embodiment two input multiplexer 440 of the FIG. 4 is replaced by a four input multiplexer 549 such that P_IN, P_OUT and output of the buffer 546 are the inputs of the multiplexer. The control signal of buffer 545 serves as one of the select lines while the second select line 557 is the logical output of the logic 556. The signal MODE_1 is the first input to the 2-input AND gate 556 and the second input is MODE_2. The main advantage of this embodiment is that it can test output buffers of bi-directional pads, which is not possible with any of the previous two bit boundary scan cell designs.

It will be apparent to those with ordinary skill in the art that the foregoing is merely illustrative and is not intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

That which is claimed is:

1. A boundary scan test circuit comprising:
   first and second multiplexers for receiving a shift/capture control signal at a control node of each of the first and second multiplexers, and for receiving first and second input signals, respectively;
   first and second capture registers coupled to outputs of the first and second multiplexers, respectively;
   first and second update registers coupled to outputs of the first and second capture registers, respectively;
   third and fourth multiplexers coupled to outputs of the first and second update registers, respectively, for receiving a mode control signal at a control node of each of the third and fourth mulitplexers;
   a buffer section coupled to outputs of the third and fourth multiplexers and to a pad for receiving an input/output signal; and
   a first four-input multiplexer receiving the mode control signal at a control node of the first four-input multiplexer and having at least one input coupled to an input of the first multiplexer and at least one input coupled to an input of the third multiplexer.

2. The boundary scan test circuit of claim 1 further comprising means for enabling EXTEST and INTEST instructions to operate independently.

3. The boundary scan test circuit of claim 1 further comprising means for enabling EXTEST and INTEST instructions to operate simultaneously.

4. The boundary scan test circuit of claim 1 further comprising means for testing a bi-directional pad.

5. The boundary scan test circuit of claim 1 further comprising a second four-input multiplexer having at least one input coupled to an input of the first four-input multiplexer.

6. The boundary scan test circuit of claim 1 further comprising a second four-input multiplexer having at least one input coupled to an output of the first four-input multiplexer.

7. The boundary scan test circuit of claim 1 wherein an output of the second four-input multiplexer provides a control signal for the first four-input multiplexer.

8. A boundary scan test circuit comprising:
   a first multiplexer circuit for receiving a core logic input signal and a shift/capture control signal;
   a capture register circuit coupled to an output of the first multiplexer circuit;
   an update register circuit coupled to an output of the capture register circuit;
   a second multiplexer circuit coupled to an output of the update register circuit for receiving a mode control signal at a control node of the second multiplexer circuit; and
   a buffer coupled to an output of the second multiplexer circuit and to a pad for receiving an input/output signal.

9. The boundary scan test circuit of claim 8 further comprising circuitry for enabling EXTEST and INTEST instructions to operate independently.

10. The boundary scan test circuit of claim 8 further comprising circuitry for enabling EXTEST and INTEST instructions to operate simultaneously.

11. The boundary scan test circuit of claim 8 further comprising circuitry for testing a bi-directional pad.

12. The boundary scan test circuit of claim 8 wherein the first multiplexer circuit comprises a four-input multiplexer.

13. The boundary scan test circuit of claim 8 wherein the second multiplexer circuit comprises a four-input multiplexer.

14. The boundary scan test circuit of claim 8 wherein an output of the fourth multiplexer in the second multiplexer circuit provides a control signal for an input of the four-input multiplexer.

15. The boundary scan test circuit of claim 8 further comprising a logic circuit coupled between the first and second multiplexer circuits.

16. The boundary scan test circuit of claim 8 wherein the capture register circuit provides a scan output signal.

17. The boundary scan test circuit of claim 8 wherein the update register circuit receives an update input signal.

* * * * *